US006508124B1

United States Patent
Zerbini et al.

(10) Patent No.: US 6,508,124 B1
(45) Date of Patent: Jan. 21, 2003

(54) MICROELECTROMECHANICAL STRUCTURE INSENSITIVE TO MECHANICAL STRESSES

(75) Inventors: Sarah Zerbini, Fontanellato (IT); Simone Sassolini, Sansepolcro (IT); Benedetto Vigna, Pietrapertosa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 12 days.

(21) Appl. No.: 09/657,294

(22) Filed: Sep. 7, 2000

(30) Foreign Application Priority Data

Sep. 10, 1999 (EP) .............................. 99830565

(51) Int. Cl.[7] ......................... G01P 15/08; G01P 15/125
(52) U.S. Cl. ................................ 73/514.32; 73/514.38
(58) Field of Search ...................... 73/514.01, 514.02, 73/514.16, 514.29, 514.32, 514.38, 504.12, 504.04

(56) References Cited

U.S. PATENT DOCUMENTS

| 5,233,213 A | 8/1993 | Marek ..................... 257/415 |
| 5,233,874 A | 8/1993 | Putty et al. ................ 73/517 |
| 5,249,465 A | * 10/1993 | Bennett et al. ............. 73/510 |
| 5,441,300 A | 8/1995 | Yokota et al. ............. 280/735 |
| 5,635,640 A | * 6/1997 | Geen ..................... 73/504.12 |
| 6,158,280 A | * 12/2000 | Nonomura et al. ...... 73/504.04 |
| 6,257,062 B1 | * 7/2001 | Rich ..................... 73/514.32 |

FOREIGN PATENT DOCUMENTS

| EP | 0 564 186 A1 | 10/1993 |
| EP | 0 578 228 A2 | 1/1994 |
| EP | 0 623 807 A1 | 11/1994 |
| WO | WO 96/35957 | 11/1996 |

OTHER PUBLICATIONS

Tang, et al., "Laterally Driven Polysilicon Resonant Microstructures," 8253 *Sensors and Actuators*, 20, Nov. 15, 1989, Nos. 1/2, Lausanne, CH, pp. 25–32.

Sze (ed.), *Semiconductor Sensors*, John Wiley & Sons, Inc., New York, 1994, pp. 32–38.

* cited by examiner

*Primary Examiner*—Helen Kwok
(74) *Attorney, Agent, or Firm*—Lisa K. Jorgenson; Robert Iannucci; Seed IP Law Group PLLC

(57) ABSTRACT

A microelectromechanical structure includes a rotor element having a barycentric axis and suspended regions arranged a distance with respect to the barycentric axis. The rotor element is supported and biased via a suspension structure having a single anchoring portion extending along the barycentric axis. The single anchoring portion is integral with a body of semiconductor material on which electric connections are formed.

19 Claims, 9 Drawing Sheets

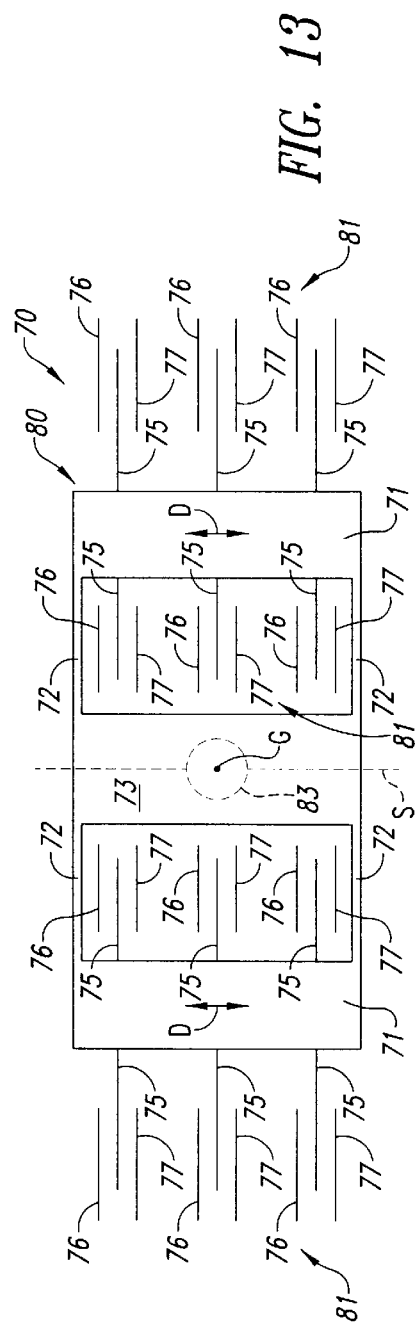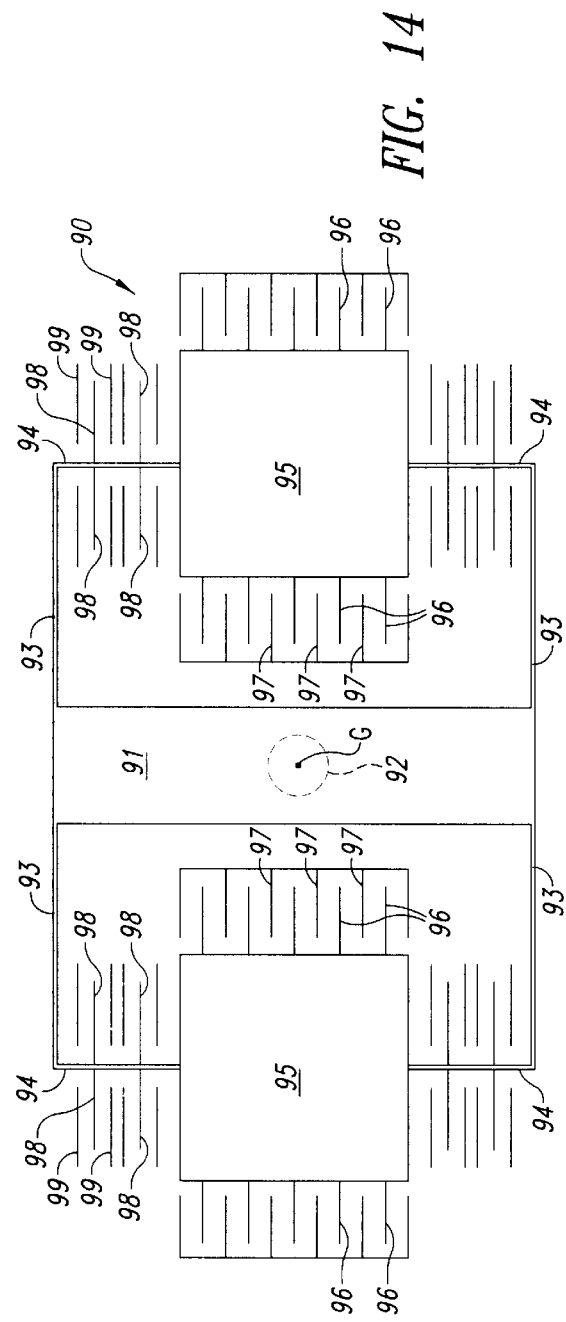

MICROELECTROMECHANICAL STRUCTURE INSENSITIVE TO MECHANICAL STRESSES

TECHNICAL FIELD

The present invention regards a microelectromechanical structure insensitive to mechanical stresses.

BACKGROUND OF THE INVENTION

As known, surface and epitaxial micromachining techniques allow production of microstructures within a layer that is deposited (for example a polycrystalline silicon film) or grown (for example an epitaxial layer) on sacrificial regions that are removed at the end of the manufacturing process by wet etching.

In general, the layers subject to manufacturing (deposited or grown layers) are formed at high temperatures, completely different from the operative temperatures. In addition, the various regions forming the end devices have different thermal expansion coefficients. Consequently, at the microstructure operative temperatures, residual mechanical stresses are present; in addition, in particular when the various regions are doped not uniformly, the stresses are not uniform (stress gradients); these stresses thus cause undesirable mechanical deformations of the microstructures, as described schematically hereinafter with reference to FIGS. 1–6.

In detail, FIG. 1 shows in cross-section a structure 1 comprising a polycrystalline silicon bridge element 2, formed on a monocrystalline silicon substrate 3; a sacrificial oxice layer 4 extends between the bridge element 2 and the substrate 3, except for two areas, where anchorage portions 5 of the bridge element 2 extend through the sacrificial oxide layer 4, and are supported directly on the substrate 3.

FIG. 2 shows the same structure 1 as in FIG. 1, in plan view.

FIGS. 3 and 4 show the structure 1, after removal of the sacrificial oxide layer 4, when the dimensions of the structure have been reduced (shown exaggerated in the figures, for better understanding), owing to the presence of residual stress; in particular, in FIG. 3, owing to the different thermal coefficient, the dimensions of the bridge element 2 are reduced (shortened) more than those of the substrate 3; here the bridge element 2 is subjected to tensile stress, and assumes a more favorable energetic configuration. In FIG. 4 on the other hand, the bridge element 2 undergoes a lesser reduction of dimensions than the substrate 3; consequently, in this condition, the bridge element 2 tends to be lengthened in comparison with the substrate 3, but, owing to the fixed anchorage portions 5, it undergoes stress of a compressive type, causing buckling deformation.

In the case of tensile stress, the mechanical resonance frequency of bridge element 2 is shifted upwards with respect to the intrinsic value (in the absence of stress); on the other hand, in the case of compressive stress, the mechanical resonance frequency of the bridge element 2 is shifted downwards.

The average residual stress thus has the effect of modifying the resilient constant of the micromechanical structures; this modification is not reproducible, and can cause mechanical collapse of the structure (in particular in the case in FIG. 4).

In FIG. 5, the projecting element 11 is formed on a monocrystalline silicon substrate 12; a sacrificial oxide layer 13 extends between the projecting element 11 and the substrate 12, except for an area, where an anchorage portion 14 of the projecting element 11 extends through the sacrificial oxide layer 13, and is supported directly on the substrate 12.

FIG. 6 shows the structure 10 of FIG. 5, after removal of the sacrificial oxide layer 13. As can be seen, the release of the residual stress gradient causes the projecting element 11 to flex. In particular, indicating with $\sigma R(z)$ the function linking the residual stress with the coordinate z in the projecting element 11, $\overline{\sigma}_R$ the average residual stress $\Gamma$ the strain gradient, and E Young's modulus, the following is obtained:

$$\sigma_R(Z) = \overline{\sigma}_R + \Gamma E z$$

In addition, indicating with L the length of the projecting element 11, flexure at its free end is independent from the thickness, and is:

$$H = \Gamma L^2 / 2$$

Consequently, a positive strain gradient $\Gamma$ causes the projecting element 11 to bend away from the substrate 12 (upwards), whereas a negative gradient causes it to bend downwards.

In case of suspended masses, the behavior is exactly the opposite, i.e., positive stress gradients cause downward flexing, and negative stress gradients give rise to upward flexing.

In addition, the material of the package has a different coefficient of thermal expansion as compared to the material of the micromechanical structure (mono- or polycrystalline silicon). Consequently, the suspended masses may be subject to small displacements with respect to the fixed region of the micromechanical structure.

The presence of residual stress inherent to the structural material and stresses induced by the packaging material jeopardizes the performance of integrated microelectromechanical devices.

For example, in the case of integrated micromechanical structures having a suspended mass, or seismic mass, provided with a plurality of anchorage points, the stresses inherently present in the materials or induced by packaging, by acting in different and non-uniform way on the various anchorage points, causes tension in some parts and compression in other parts, such as to modify the mutual positions of these parts and to generate non-symmetrical geometries of the structures.

For example, consider the case of an angular accelerometer with a suspended mass having an annular shape set outside the center of gravity of the suspended mass, so as to have a high moment of inertia and hence a high sensitivity. Such an accelerometer is illustrated schematically in FIG. 7 and in detail in FIG. 8, showing only one part thereof.

FIG. 7 shows a semiconductor material chip 20 housing an angular accelerometer 21 comprising a rotor 22 and a stator 23. The chip 20 may moreover house circuit components (not shown) for biasing, controlling the processing signals. The angular accelerometer 21 has a barycentric axis G (defined as an axis passing through the center of gravity—not shown) coinciding with the axis of symmetry of the accelerometer. The rotor 22 (which is able to perform micrometric rotations about the barycentric axis G, in such a way that every movement of the rotor is defined by instantaneous vectors perpendicular to the barycentric axis G) comprises a suspended mass 25 having an annular shape concentric to the barycentric axis G and bearing a plurality of mobile electrodes 26 extending radially inwards from the suspended mass 25. Each mobile electrode 26 is associated with two fixed electrodes 27, 28 extending radially, each of which faces a different side of the respective mobile electrodes 26. The fixed electrodes 27, 28, forming together the stator 23, in practice define, together with the respective mobile electrodes 26, a plurality of capacitive circuits; namely, all the fixed electrodes 27, arranged on first sides (for example, on the left in the clockwise direction) of the respective mobile electrode 26, form first capacitors with the respective mobile electrodes, whilst all the fixed electrodes 28, arranged on second sides (for example, on the right in the clockwise direction) of the respective mobile electrodes 26, form second capacitors with the respective mobile electrodes. The first capacitors are connected in parallel with each other and the second capacitors are also connected in parallel with each other. The first capacitor and the second capacitor associated with the same mobile electrode 26 are, instead, connected in series.

In a per se known manner, any movement of the suspended mass 25 brings about an increase in the capacitance of one of the two capacitors associated to each mobile electrode 26 and a reduction in the capacitance of the other capacitor. Consequently, by appropriately biasing the mobile electrodes 26 and the fixed electrodes 27, 28 and by connecting them to a circuit that measures the capacitance, it is possible to detect any movement of the suspended mass 25 with respect to the stator 23.

In the accelerometer 21 of FIG. 7, the suspended mass 25 is supported and biased by a suspension structure comprising springs 30 and rotor anchorage regions 34. The springs 30 are arranged at 90° with respect to one another and extend radially between sets of mobile electrodes 26 and fixed electrodes 27, 28. In particular, as is better illustrated in the detail of FIG. 8, each spring 30 comprises a pair of lateral arms 31 extending radially inwards from the suspended mass 25, at a distance from one another, and connected to one another at their radially inner ends by a cross portion 32. A central arm 33 thus extends radially from the center of the cross portion 32 between the side arms 31 for approximately one half of the length of the sidearms 31 and terminates at the rotor anchorage region 34, which is integral with the chip 20. The springs 30 are suspended and hence are deformable as a result of the rotation of the suspended mass 25.

FIG. 8 moreover shows stator anchorage regions 35a, 35b integral with the fixed electrodes 27 and 28, respectively. The stator anchorage regions 35a, 35b have a width greater than the fixed electrodes 27, 28, extend in depth as far as the substrate (in a not shown manner), and protrude on the sides of the fixed electrodes 27, 28 not facing the respective mobile electrodes 26. In FIG. 8, a trench 38 separates the mobile mass 25 from the rest of the chip 20.

With the angular accelerometer of FIG. 7, the problem arises that residual stresses or stresses linked to the materials and acting on the rotor 22 cause tensions and compressions of the springs 30, deforming the rotor 22 in a non-foreseeable way.

The angular accelerometer 21 thus presents reduced performance in terms of sensitivity and precision. In addition, the variations in performance are non-uniform on components belonging to different batches and, at times, on components belonging to a same batch.

SUMMARY OF THE INVENTION

An embodiment of the invention is directed to a microelectromechanical structure that includes a first plurality of stator elements and a rotor having a baycentric axis. The rotor includes a central anchor portion through which the barycentric axis extends; a first seismic mass separated from the central anchor portion; a first plurality of mobile rotor elements interleaved with the plurality of stator elements, the rotor elements extending from and being supported by the first seismic mass; and a first plurality of flexible support arms extending between the first seismic mass and the central anchor portion, the support arms flexibly supporting the first seismic mass such that the seismic mass and rotor elements are movably coupled to the central anchor portion. The microelectromechanical structure can implement various devices, including an angular accelerometer, a linear accelerometer, and a gyroscope.

BRIEF DESCRIPTION OF THE DRAWINGS

For a better understanding of the present invention, preferred embodiments thereof are described hereinafter, only as non-limiting examples, with reference to the attached drawings, wherein:

FIG. 13 is a schematic representation of an integrated linear accelerometer according to the present invention; and FIG. 14 is a schematic representation of an integrated gyroscope according to the present invention.

DETAILED DESCRIPTION OF THE INVENTION

Figure 1:
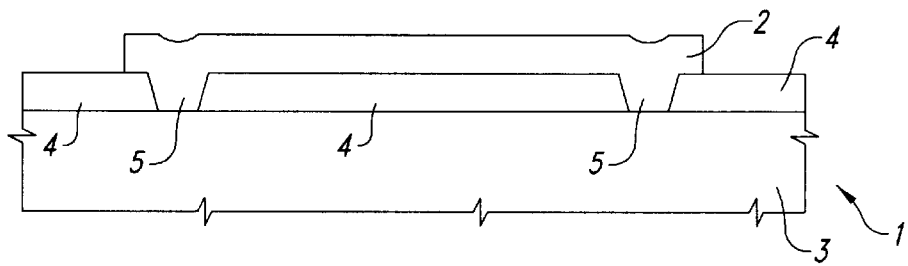
FIG. 1 shows a cross section through a semiconductor material wafer in an intermediate manufacturing step of a first known microintegrated structure.
Figure 2:
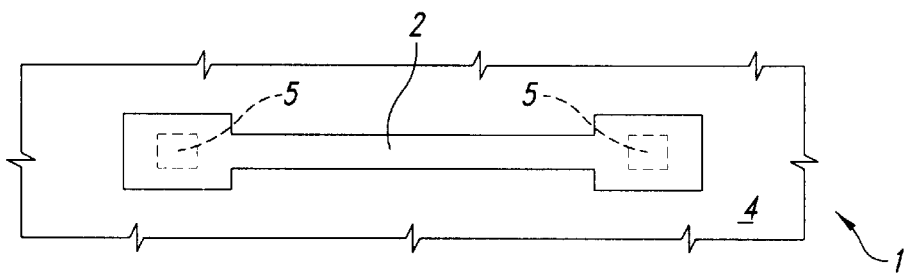
FIG. 2 is a top view of the item of FIG. 1.
Figure 3:
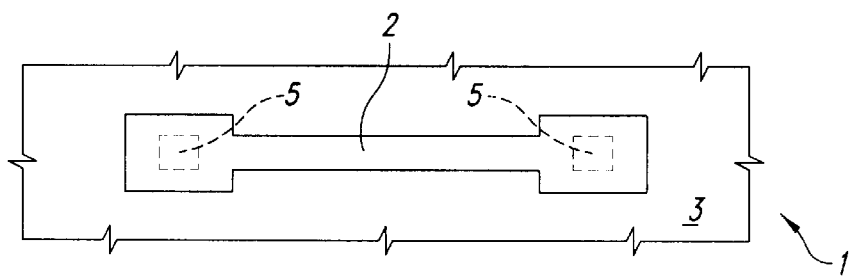
FIGS. 3 and 4 show top views similar to FIG. 2, at the end of the known manufacturing process, in the presence of a first and, respectively, a second stress condition.
Figure 4:
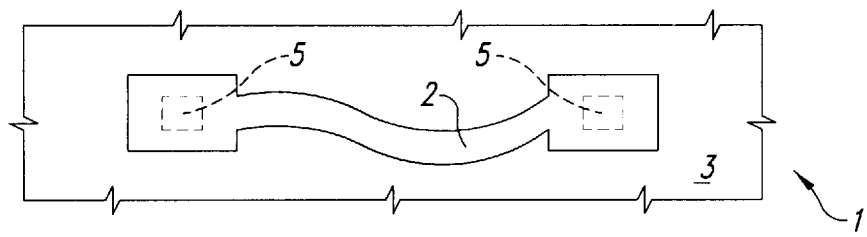
Figure 5:
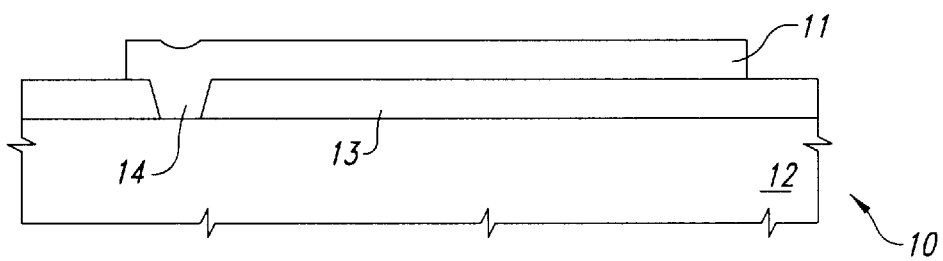
FIG. 5 shows a cross section through a semiconductor material wafer in an intermediate manufacturing step of a second known microintegrated structure.
Figure 6:
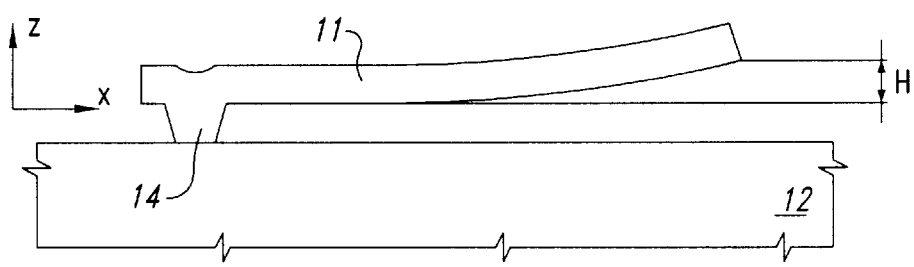
FIG. 6 shows the same cross section as FIG. 5, at the end of the known manufacturing process, in presence of a stress condition.
Figure 7:
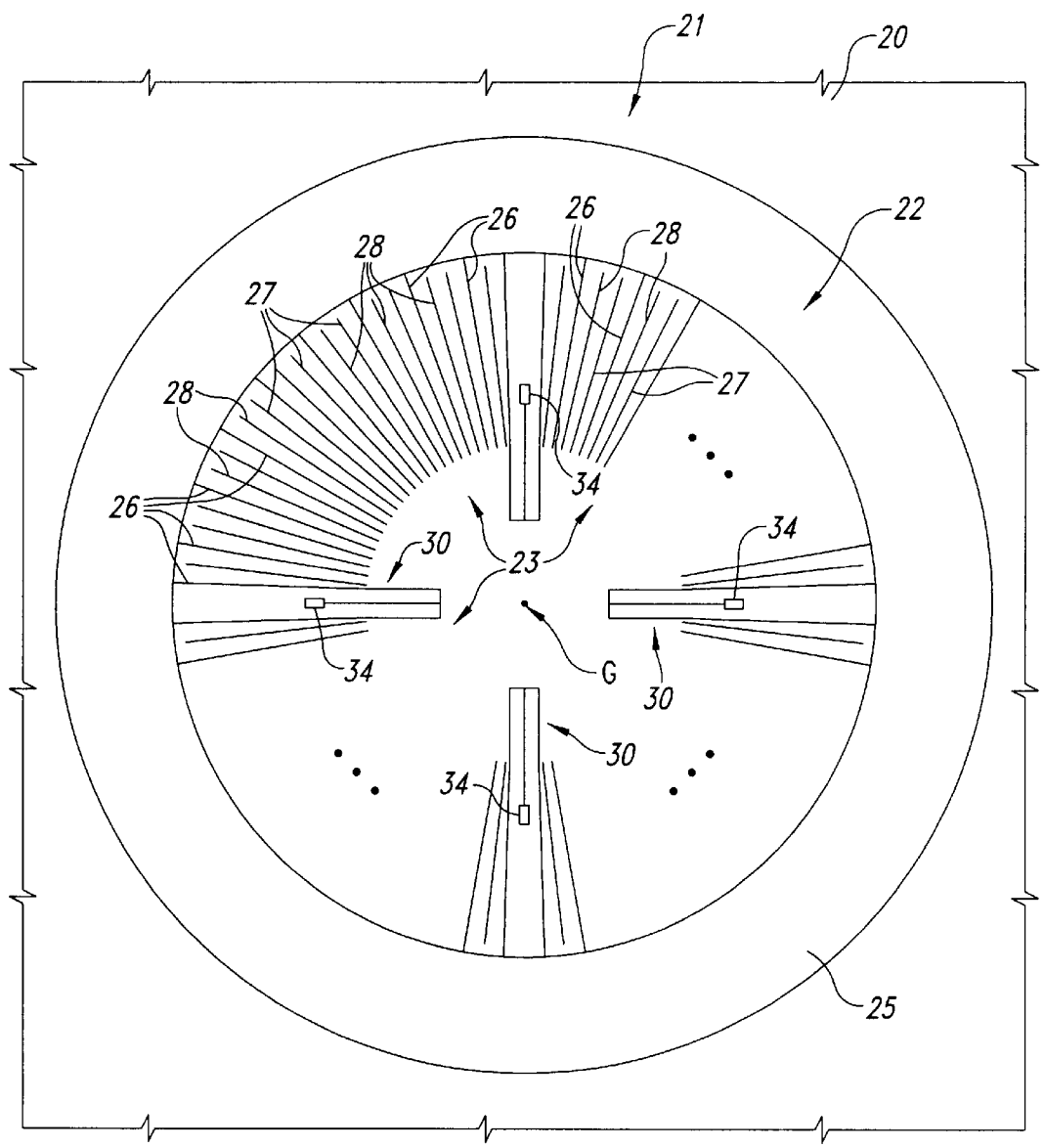
FIG. 7 is a schematic representation of an integrated angular accelerometer of a known type.
Figure 9:
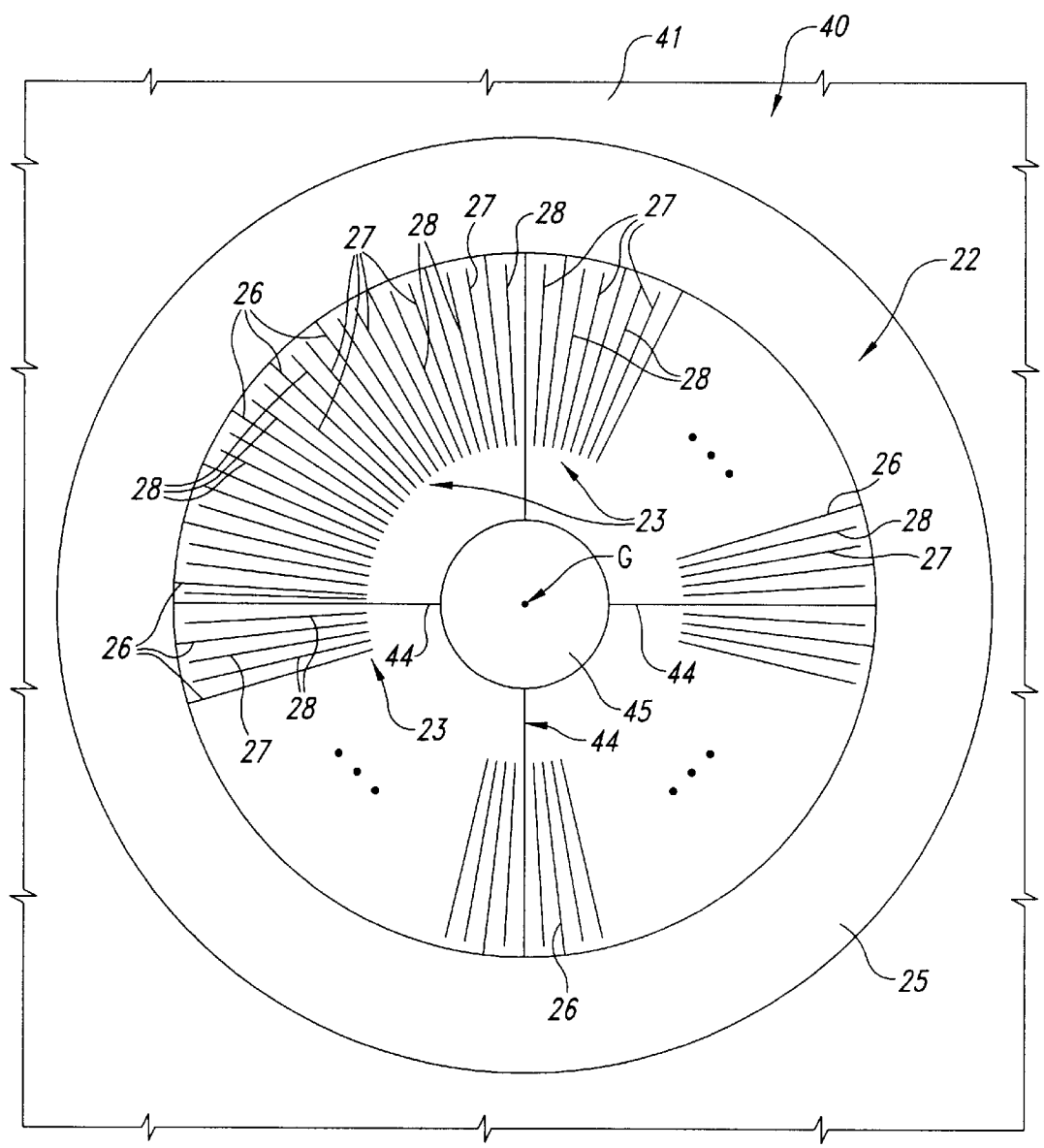
FIG. 9 is a schematic representation of an integrated angular accelerometer according to the present invention.

With reference to FIG. 9, an angular accelerometer 40 is integrated in a chip 41 of semiconductor material and has a general structure similar to that of FIG. 7. Consequently, the parts of the accelerometer 40 of FIG. 9 that are in common with those of the accelerometer 20 of FIG. 7 are denoted by the same reference numbers and will not be further described.

Figure 10:
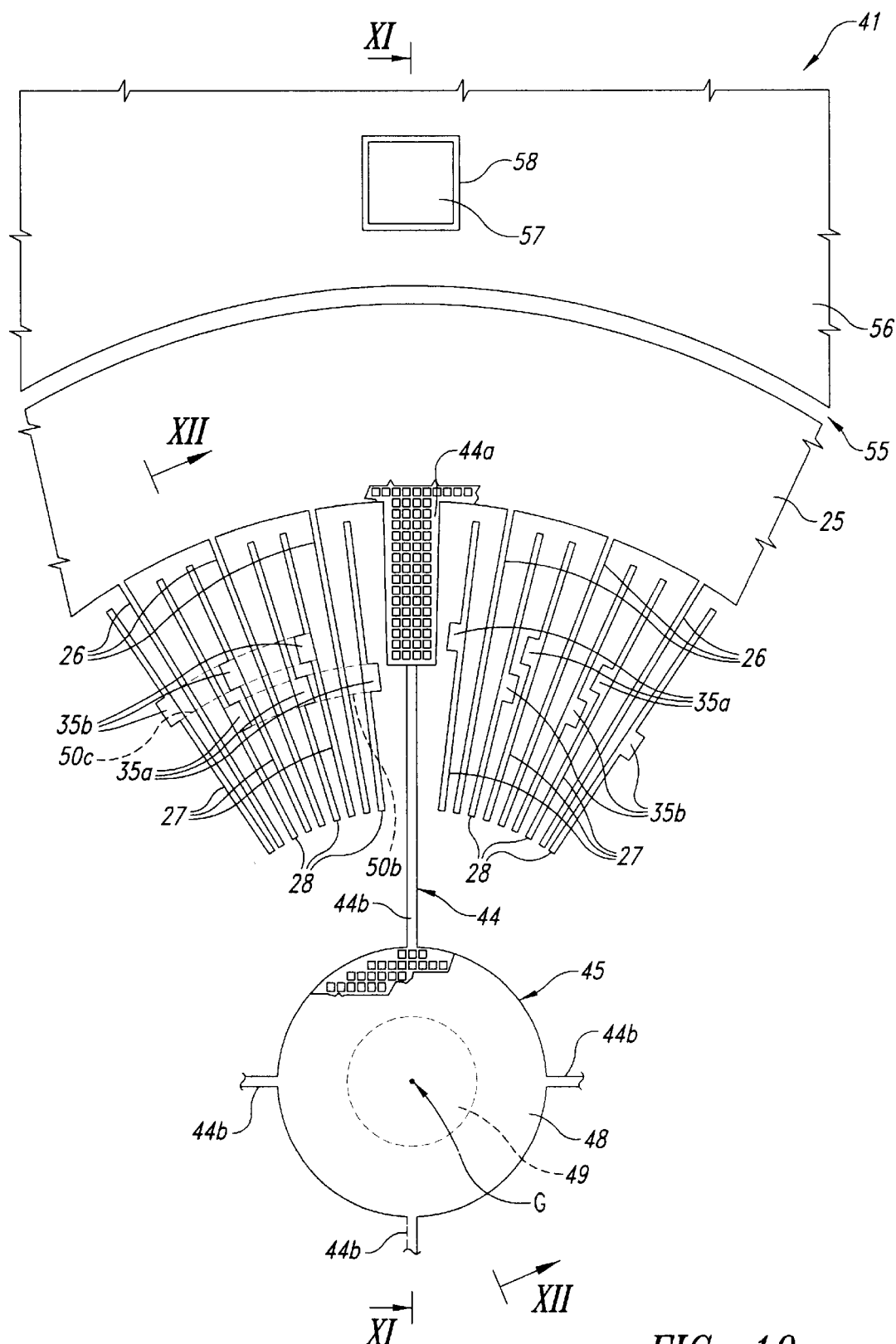
FIG. 10 shows an enlarged detail of the accelerometer of FIG. 9.

The suspension mass 25 of the angular accelerometer 40 is supported and biased by as suspension structure comprising four springs 44 and a single anchoring element 45. The springs 44 extend radially and are set 90° apart. In particular, the springs 44 extend between the suspended mass 25 and the anchoring element 45, and the latter is arranged concentrically with respect to the suspended mass 25 along the barycentric axis G of the angular accelerometer 40. As shown in detail in FIG. 10, the springs 44 preferably comprise a first, outer, portion 44a and a second, inner, portion 44b. The first portion 44a extends for approximately one third of the length of the spring 44, has a width greater than the second portion 44b (which in practice defines the elastic part that is deformed during rotation of the rotor 22), and is preferably perforated, as is the suspended mass 25, to enable releasing of the rotor 22.

The anchoring element 45 (see also FIGS. 11 and 12) comprises a cylindrical body 48, which, in its circumferentially outer portion, is perforated to reduce the size of the anchorage and at the bottom has an anchoring portion 49 having a smaller diameter than the cylindrical body 48. The anchoring portion 49, which is made in a single piece with the cylindrical body 48, is contiguous to a first biasing region 50a (see FIG. 11), preferably of polycrystalline silicon, which extends above a substrate 51 and is insulated from the latter by an insulating material region 52a, for example silicon dioxide.

In particular (FIG. 11), the first biasing region 50a forms a connection line that extends from beneath the anchoring portion 49 in radial direction towards the outside of the angular accelerometer 40, passing underneath an annular trench 55 separating the mobile mass 25 from a bulk 56 of the chip 41, and the ending underneath a biasing sinker region 57. The biasing sinker region 57 is laterally surrounded by an isolation trench 58 (FIGS. 10 and 11) and is connected at the top by electric contact, in a per se known manner, shown only schematically in FIG. 11.

Figure 11:
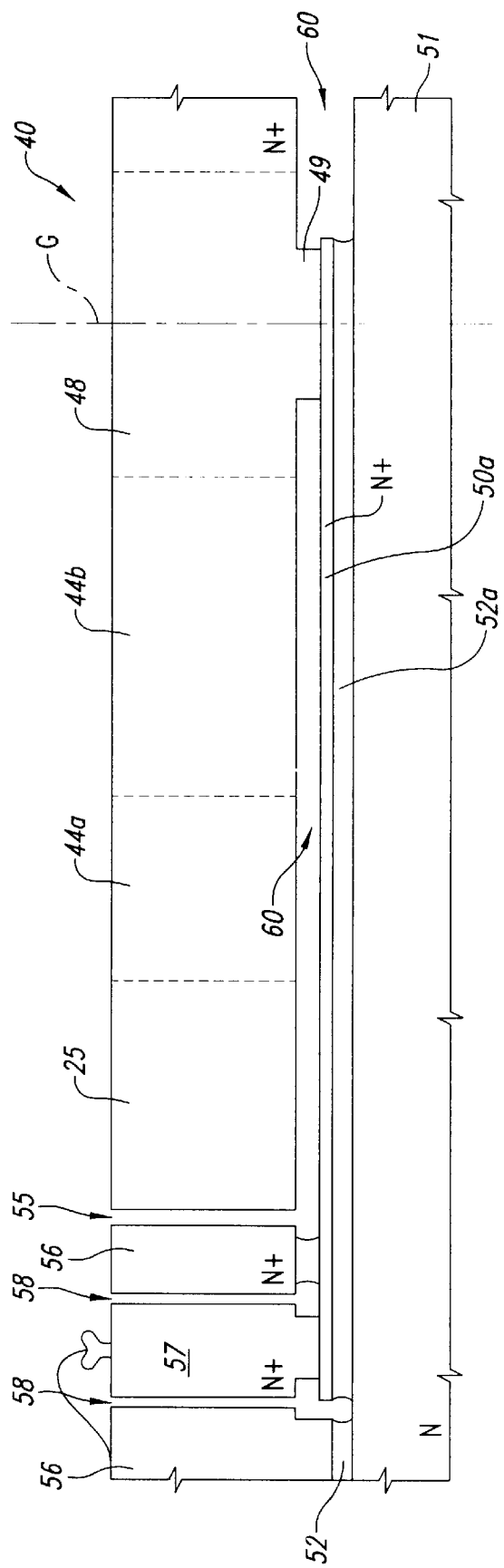
FIG. 11 is a cross-section taken along line XI—XI of FIG. 9.
Figure 12:
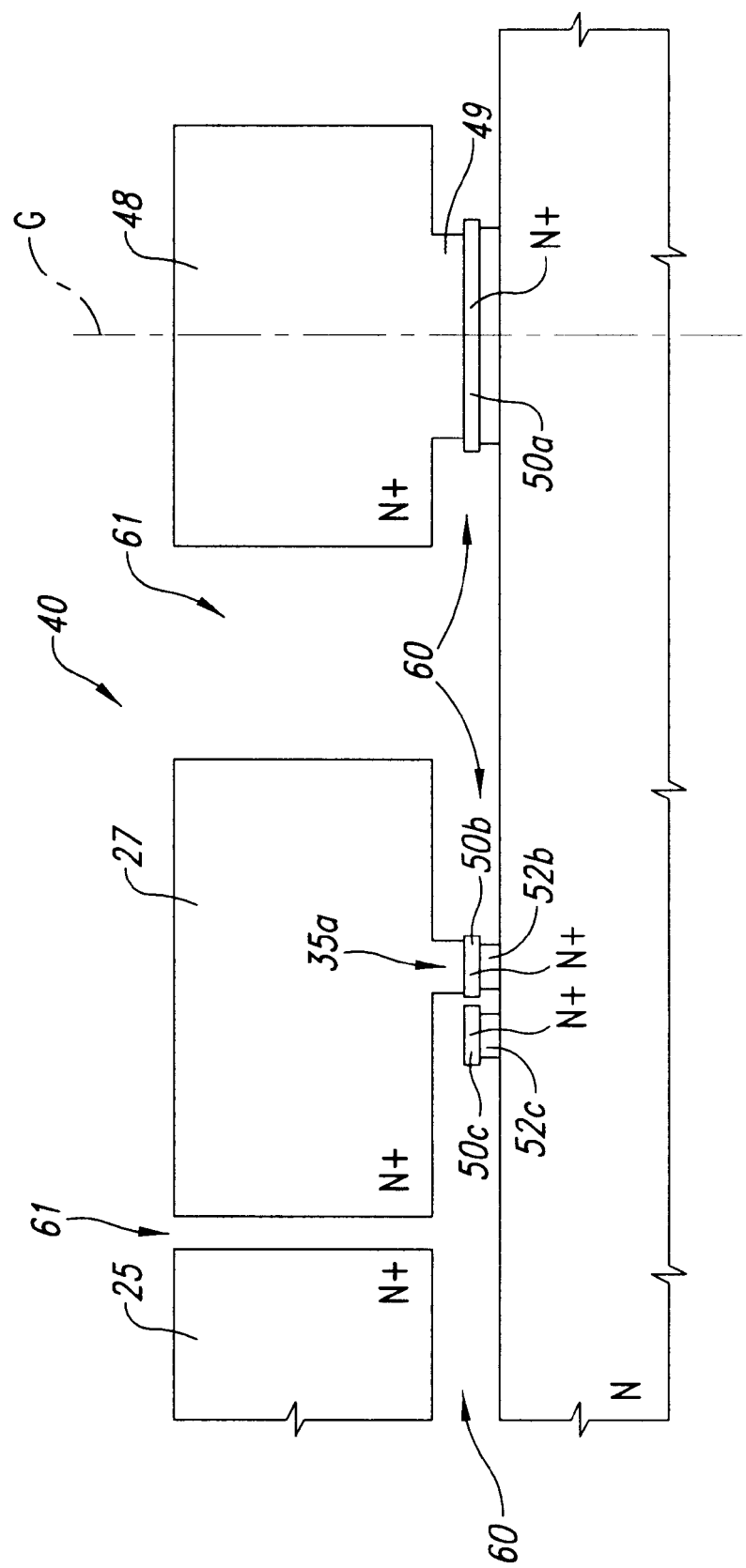
FIG. 12 is a cross-section taken along line XII—XII of FIG. 9.

In addition, as is shown in FIG. 12 and analogously to the first biasing region 50a, a second biasing region 50b and a third biasing region 50c extend above the substrate 51 and are insulated therefrom by insulating material regions 52b and, respectively, 52c, for example of silicon dioxide. The biasing regions 50b and 50c extend annularly along two concentric circumferences (FIG. 10) and are connected with respective stator anchorage regions 35a, 35b of the fixed electrodes 27, 28 respectively, as may be seen in FIG. 12 for one fixed electrode 27 only. The biasing region 50b and 50c are connected to radial lines (not shown) in a way similar to the first biasing region 50a so as to connect the respective stator anchorage regions 35a, 35b with respective contact sinker region (not shown) similar to the biasing sinker region 57 shown in FIG. 11. Furthermore, the biasing regions 50b and 50c are interrupted only at the first biasing region 50a, and, as regards the outer biasing region 50c, at the radial lines connected to the second biasing region 50b.

An air gap region 60 extends above the substrate 51 and beneath the rotor 22 and the fixed electrodes 27, 28, and is interrupted only by the anchoring portion 49 of the anchoring element 45 and by the stator anchorage regions 35a, 35b. Finally, a trench 61 separates the mobile mass 25, the mobile electrodes 26, and the anchoring element 45 from the fixed electrodes 35a, 35b, as well as the fixed electrodes 35a, 35b, from one another.

The biasing regions 50a–50c are formed starting from a single polysilicon layer deposited on top of an oxide layer and are shaped prior to forming a sacrificial layer which is to be removed for forming the air gap region 60. The operation of removal of the sacrificial layer moreover involves the removal of the underlying oxide layer, except for the portions arranged underneath the biasing regions 50a–50c and forming the insulating material regions 52a–52c.

Figure 8:
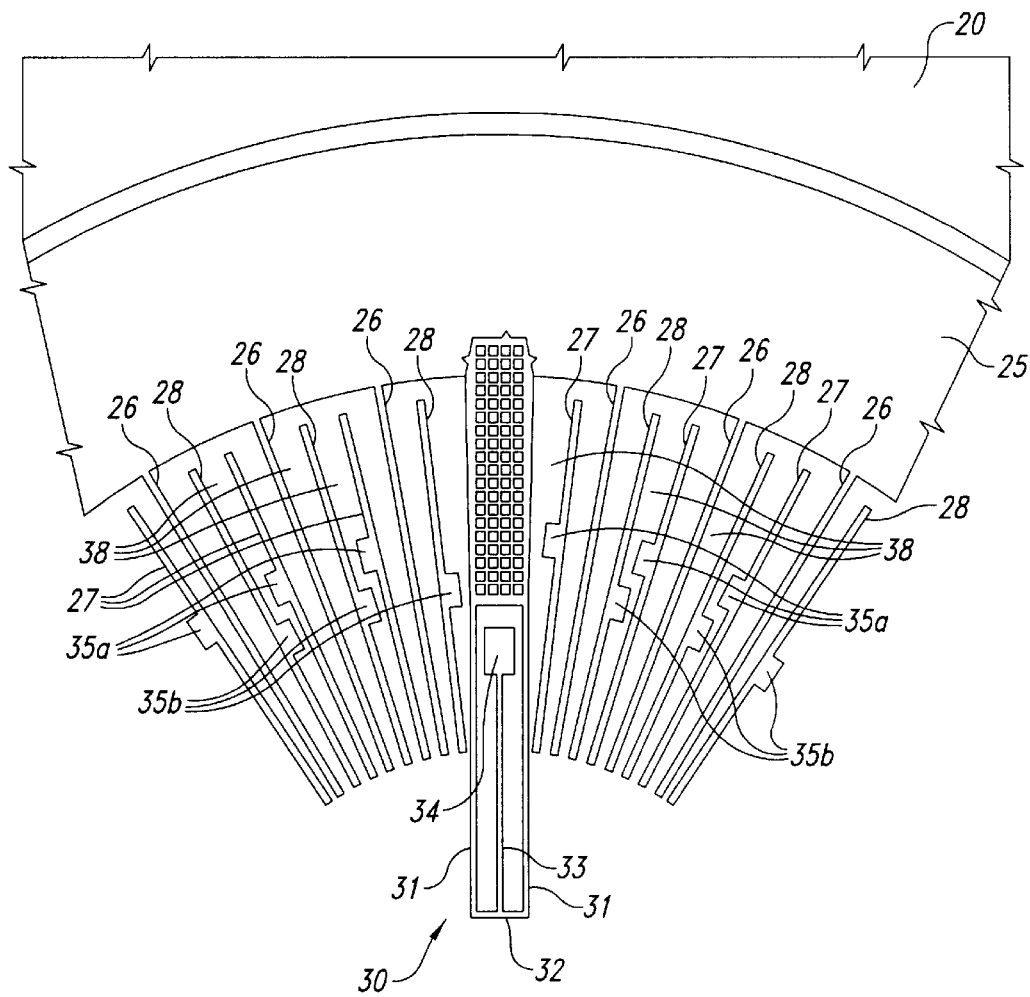
FIG. 8 shows an enlarged detail of the accelerometer of FIG. 7.

Thus, with the solution illustrated in FIGS. 9–12, the rotor 22 is supported and biased by the anchoring structure 45, 49, which is concentric with and is passed by the barycentric axis G. Consequently, the angular accelerometer 40 is far less sensitive to residual stresses than the device shown in FIGS. 7 and 8. In fact, the stress induced by the package at most generates a shift of the mobile mass 25 and does not deform the springs 30, as in the case of structures with a plurality of anchoring elements, which may undergo displacements different from one another, causing deformation of the structure as a whole. Consequently, the present accelerometer presents a far superior performance during the front-end and back-end steps.

These advantages are achieved without additional costs, in that the present accelerometer only requires a modification at the design level and does not entail additional operations in the fabrication phase.

The present invention is moreover applicable to micromechanical structures of any type, such as linear accelerometers, in addition to angular ones, oscillators, mechanical filters, and gyroscopes. Examples of a linear accelerometer and, respectively, of a gyroscope according to the present invention are schematically shown in FIG. 13 and 14.

In detail, the linear accelerometer 70 of FIG. 13 comprises a pair of seismic masses 71 having a basically rectangular shape and extending parallel to and at a distance from each other, as well as at a distance from the barycentric axis G of the accelerometer. The seismic masses 71 are connected via four springs 72 to a central beam 73, which also has a rectangular shape and extends parallel to the seismic masses 71 in a central position. In detail, the springs 72, which have a reduced width so that they are able to undergo deformation to enable displacement of the seismic masses 71 in the direction of the arrows D, and hence in a direction basically perpendicular to the barycentric axis G, extend from the shorter sides of the rectangles forming the seismic masses 71, as far as the shorter sides of the rectangle forming the central beam 73. Mobile electrodes 75 extend from the two longer sides of the two rectangular forming the seismic masses 71 and face, each, a pair of fixed electrodes 76, 77. The fixed electrodes 76 are all electrically connected together, and the fixed electrodes 77 are all electrically connected together. The seismic masses 71 and the mobile electrodes 75 form the rotor 80 of the linear accelerometer 70, while the fixed electrodes 76, 77 form the stator 81.

The central beam 73 is integral with a single anchoring portion 83, dashed in FIG. 13 and made in a way similar to the anchoring portion 49 of FIG. 11. In particular, the center of the anchoring portion 83 is arranged on the barycentric axis G of the linear accelerometer 70, so that the latter is made largely insensitive to residual stresses and less subject to damage in the fabrication phase, just as was described above with reference to the angular accelerometer 40.

The angular speed sensor, or gyroscope, 90 of FIG. 14 has a central beam 91 supported by a single anchoring portion 92 (shown dashed) on the substrate (not shown), like the anchoring portion 83 of FIG. 13. Four first springs 93 similar to the springs 72 of FIG. 13 extend from the two shorter sides of the central beam 91, parallel thereto, and four second springs 94 extend at 90° from the first springs 93, connected in couples to respective seismic masses 95. In practice, the first springs 93 and the second springs 94 provide two degrees of freedom to the sensor, which is able to move in a micrometric manner in any direction resulting from the vector sum of the direction of the first and second springs 93, 94, in a plane perpendicular to the barycentric axis G.

Mobile excitation electrodes 94 extend from the two sides of each seismic mass 95, perpendicularly to the second springs 94, and hence parallel to the first springs 93. The mobile excitation electrodes 96 are arranged interleaved with fixed excitation electrodes 97.

In addition, mobile sensing electrodes 98 extend from the two sides of each second spring 94 and are perpendicular to the second springs 94 and hence parallel to the first springs 93. The sensing electrodes 98 are arranged interleaved with fixed sensing electrodes 99 for detecting the Coriolis force.

Like the linear accelerator 70 of FIG. 13, also the angular speed sensor 90 of FIG. 14 thus has a single anchoring region 92 arranged along the barycentric axis G of the structure, and consequently presents the advantages described above.

Finally, it is clear that numerous modifications and variations may be made to the micro-electromechanical structures described and illustrated herein, all falling within the scope of the invention as defined in the attached claims. In particular, it is emphasized that the invention is applicable to all microstructures that may be made using microelectronic techniques and are equipped with suspended masses arranged in a remote position from the center gravity, irrespective of the type of microstructure, the type of machining (epitaxial, surface, or bulk micromachining) and of the material used (monocrystalline or polycrystalline silicon, either grown or deposited, or metallic materials).

What is claimed is:

1. A microelectromechanical structure comprising a rotor element having a barycentric axis and including suspended regions arranged at a distance with respect to said barycentric axis, wherein said rotor element is connected to a single anchoring portion extending along said barycentric axis, wherein the microelectromechanical structure is an angular accelerometer, and said rotor element comprises a suspended mass of annular shape concentric with said barycentric axis and connected to said single anchoring portion through a suspension structure, said suspending mass bearing a plurality of mobile electrodes extending radially towards said barycentric axis and interleaved with a plurality of fixed electrodes.

2. The microelectromechanical structure according to claim 1, wherein in that said single anchoring portion is integral with a body of semiconductor material.

3. The microelectromechanical structure according to claim 1, wherein said suspension structure comprises suspended arms extending radially, at a uniform angular distance from each other, from said suspended mass towards a central anchoring element integral with said anchoring portion, said anchoring portion being integral with a substrate of semiconductor material.

4. The microelectromechanical structure according to claim 3, wherein said central anchoring element is in electrical contact, through said anchoring portion, with an electrical connection region extending over said substrate and beneath said rotor element; said electrical connection region being isolated from said rotor element by an air gap region.

5. The microelectromechanical structure according to claim 1, wherein said rotor element is of semiconductor material.

6. A microelectromechanical structure, comprising:
a first plurality of stator elements; and
a rotor having a barycentric axis and including:
  a central anchor portion through which the barycentric axis extends;
  a first seismic mass separated from the central anchor portion;
  a first plurality of mobile rotor elements interleaved with the plurality of stator elements, the rotor elements extending from and being supported by the first seismic mass; and
  a first plurality of flexible support arms extending between the first and seismic mass and the central anchor portion, the support arms flexibly supporting the first seismic mass such that the seismic mass and rotor elements are movable coupled to the central anchor portion.

7. The microelectromechanical structure according to claim 6, further comprising:
a second seismic mass extending at a distance from the first seismic mass on an opposite side of said barycentric axis;
second and third pluralities of stator element; and
a suspension structure connected between said central anchor portion and said second seismic mass, said second seismic mass bearing second and third pluralities of mobile rotor elements, said second and third pluralities of mobile rotor elements extending from a different side of said second seismic mass and being interleaved with said second and third pluralities of stator elements, respectively.

8. The microelectromechanical structure according to claim 7, wherein said suspension structure comprises first spring elements extending perpendicularly to said seismic masses towards the central anchor portion, said central anchor portion being integral with a substrate of semiconductor material.

9. The microelectromechanical structure according to claim 8, wherein said central anchor portion is a beam element extending parallel to said seismic masses.

10. The microelectromechanical structure according to claim 7, wherein the microelectromechanical structure comprises a linear accelerometer.

11. The microelectromechanical structure according to claim 7, wherein the microelectromechanical structure comprises a gyroscope.

12. The microelectromechanical structure according to claim 7, wherein said suspension structure comprises a second plurality of flexible support arms connected between said central anchor portion and said second seismic mass; each said flexible support arm of said second plurality of flexible support arms bearing fourth and fifth pluralities of mobile rotor elements, each plurality of the fourth and fifth pluralities of mobile rotor elements extending from a different side of a respective flexible support arm of said second plurality of support arms and being interleaved with a respective plurality of stator elements.

13. The microelectromechanical structure of claim 6 wherein the first seismic mass has an annular shape concentric with said barycentric axis and the support arms extend radially from the central anchor portion to the first seismic mass.

14. The microelectromechanical structure of claim 13 wherein the rotor elements extend radially inwardly from the first seismic mass to the central anchor portion.

15. The microelectromechanical structure of claim 13, further comprising:
an electrical connection region in contact with and extending from the central anchor portion to an electrical contact, the connection region extending beneath the first seismic mass and isolated from the first seismic mass by a first air gap, the rotor elements being electrically connected to the electrical contact through the first seismic mass, at least one of the support arms, the central anchor portion, and the connection region.

16. The microelectromechanical structure of claim 6 further comprising:
- a second plurality of stator elements; wherein the rotor further includes:
  - a second seismic mass positioned on an opposite side of the central anchor portion from the first seismic mass;
  - a second plurality of mobile rotor elements interleaved with the second plurality of stator elements, the second plurality of rotor elements extending from and being supported by the first seismic mass; and
  - a second plurality of flexible support arms extending between the second seismic mass and the central anchor portion, the second plurality of support arms flexibly supporting the second seismic mass such that the second seismic mass and second plurality of rotor elements are movably coupled to the central anchor portion.

17. The microelectromechanical structure of claim 6, further comprising:
- a second seismic mass separated from the central anchor portion;
- a second plurality of stator elements; and
- a second plurality of mobile rotor elements interleaved with the second plurality of stator elements, the second plurality of mobile rotor elements extending from and being supported by the second seismic mass, wherein the first plurality of stator elements and the first plurality of mobile rotor elements are positioned between the first seismic mass and the central anchor portion and the second plurality of stator elements and the second plurality of rotor elements are positioned between the second seismic mass and the central anchor portion.

18. The microelectromechanical structure of claim 6 wherein the first plurality of flexible support arms includes first and second support arms, the first support arm extending from a first end of the central anchor portion to a first end of the first seismic masses and the second support arm extending from a second end of the central anchor portion to a second end of the first seismic mass and the rotor further includes:
- a second seismic mass separated from the central anchor portion;
- a third support extending from the first end of the central anchor portion to a first end of the second seismic mass; and
- a fourth support arm extending from the second end of the central anchor portion to a second end of the second seismic mass.

19. The microelectromechanical structure of claim 6, further comprising second, third, and fourth pluralities of stator elements, wherein the first plurality of flexible support arms includes first and second flexible support arms and the rotor further includes:
- a second seismic mass separated from the central anchor portion;
- a third flexible support arm extending between the second seismic mass and the central anchor portion;
- a second plurality of mobile rotor elements interleaved with the second plurality of stator elements, the second plurality of mobile rotor elements extending from the second seismic mass;
- a third plurality of mobile rotor elements extending from the first flexible support arm and interleaved with the third plurality of stator elements; and
- a fourth plurality of mobile rotor elements extending from the second flexible support arm and interleaved with the fourth plurality of stator elements.

* * * * *

UNITED STATES PATENT AND TRADEMARK OFFICE
CERTIFICATE OF CORRECTION

PATENT NO.    : 6,508,124 B1
DATED         : January 21, 2003
INVENTOR(S)   : Sarah Zerbini et al.

It is certified that error appears in the above-identified patent and that said Letters Patent is hereby corrected as shown below:

Column 7,
Line 38, "said suspending mass" should read as -- said suspended mass --.

Column 8,
Line 16, "stator element;" should read as -- stator elements; --.

Column 10,
Line 9, "third support extending" should read as -- third support arm extending --.

Signed and Sealed this

First Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,508,124 B1
APPLICATION NO. : 09/657294
DATED : January 21, 2003
INVENTOR(S) : Sarah Zerbini et al.

It is certified that error appears in the above-identified patent and that said Letters Patent is hereby corrected as shown below:

<u>Column 8</u>
Line 6, "first and seismic mass" should read as --first seismic mass--.

<u>Column 8</u>
Line 9, "are movable coupled" should read as --are movably coupled--.

<u>Column 9</u>
Line 11, "first seismic mass" should read as --second seismic mass--.

Signed and Sealed this

Fourteenth Day of August, 2007

JON W. DUDAS
*Director of the United States Patent and Trademark Office*